United States Patent [19]
Sato et al.

[11] Patent Number: 5,568,077
[45] Date of Patent: Oct. 22, 1996

[54] LATCH CIRCUIT

[75] Inventors: Fumiki Sato; Kouichi Fujita, both of Itami, Japan

[73] Assignee: Mitsubishi Denki Kabushiki Kaisha, Tokyo, Japan

[21] Appl. No.: 449,147

[22] Filed: May 24, 1995

[30] Foreign Application Priority Data

Nov. 7, 1994 [JP] Japan .................... 6-272576

[51] Int. Cl.⁶ .................... H03K 3/286; H03K 3/356
[52] U.S. Cl. .................... 327/199; 327/208; 327/210; 327/215
[58] Field of Search .................... 327/199, 202, 327/203, 205, 206, 208–215, 219, 223, 225

[56] References Cited

U.S. PATENT DOCUMENTS

| 4,692,634 | 9/1987 | Fang et al. | 327/203 |
| 5,036,217 | 7/1991 | Rollins et al. | 327/200 |
| 5,189,319 | 2/1993 | Fung et al. | 327/225 |
| 5,391,935 | 2/1995 | Gersbach et al. | 327/201 |

FOREIGN PATENT DOCUMENTS 4-261217  9/1992  Japan .................... 327/199

*Primary Examiner*—Timothy P. Callahan
*Assistant Examiner*—T. Lam
*Attorney, Agent, or Firm*—Lowe, Price, LeBlanc & Becker

[57] ABSTRACT

A latch circuit comprises, as a circuit corresponding to 1 bit, a flip-flop 50 which is composed of a plurality of NAND gates 11a, 11b, and holds a given signal value and outputs the positive logic value to a Q signal line 5a and the negative logic value to a /Q signal line 5b, and a differential amplifying circuit composed of a plurality of P-type FETs and N-type FETs and having a characteristics such that, an input voltage to the flip-flop 50, when the signal to be held is given, starts to fall before the time point when a drop in voltage of either an X signal line 4a or a /X signal line 4b becomes larger than the difference between a source voltage and a threshold voltage of the NAND gates 11a, 11b. The latch circuit is mainly used as internal elements of a data processor, whereby when the signal is inputted, an voltage of the input signal to the flip-flop 50 of the latch circuit approaches to the threshold voltage of the logic gates constituting the flip-flop 50.

6 Claims, 6 Drawing Sheets

LATCH CIRCUIT

BACKGROUND OF THE INVENTION

1. Field of the Invention

The present invention relates to a latch circuit, more particularly, it relates to a latch circuit used as a component element such as a data processor integrated in a semiconductor substrate.

2. Description of the Related Art

In interconnection between a register for holding data, a latch circuit for holding the content of the register temporarily, an arithmetic unit and so on in a data processor integrated in a semiconductor substrate, such configuration that two signal lines of positive logic and negative logic in one signal is frequently adopted in order to simplify the circuit.

FIG. 1 is a schematic block diagram snowing a state where the register, latch circuit, arithmetic unit and so on are interconnected with the two signal lines of positive logic and negative logic. This configuration itself is same as that in the present invention to be described later.

In FIG. 1, numeral 1 designates a register, numeral 2 designates a latch circuit holding an output signal of the register 1 temporarily, and numeral 3 designates an arithmetic unit which inputs an output of the latch circuit 2 and the other signal not shown so as to perform an arithmetic operation. An output of the operation result by the arithmetic unit 3 is feedback to and stored into the register 1.

Characters 4a, 4b respectively show an X signal line of positive logic and a /X signal line of negative logic for sending the content of the register 1 as a signal X to the latch circuit 2. Characters 5a, 5b respectively show a Q signal line of positive logic and a /Q signal line of negative logic for sending an output of the latch circuit 2 as a signal Q to the arithmetic unit 3. Characters 6a, 6b respectively show an S signal line of positive logic and a /S signal line of negative logic for sending an output of the arithmetic unit 3 as a signal S to the register 1.

The X signal line 4a is of positive logic and the /X signal line 4b is of negative logic. Thus, it means that a value of the signal X is "1" when the X signal line 4a is of logic "1" and the /X signal line 4b is of logic "0", and the value of the signal X is "0" when the X signal line 4a is of logic "0" an the /X signal line 4b is of logic "1".

Also, the Q signal line 5a is of positive logic and the Q signal line 5b is of negative logic. Thus, it means that a value of the signal Q is "1" when the Q signal line 5a is of logic "1" and the /Q signal line 5b is of logic "0", and that the value of the signal Q is "0" when the Q signal line 5a is of logic "0" and the /Q signal line 5b is of logic "1".

Furthermore, the S signal line 6a is of positive logic and the /S signal line 6b is of negative logic. Thus, it means that a value of the signal S is "1" when the S signal line 6a is of logic "1" and the /S signal line 8b is of logic "0", and that the value of the signal S is "0" when the S signal line 6a is of logic "0" and the /S signal line 6b is of logic "1".

FIG. 2 is a circuit diagram specifically showing a conventional configuration of a portion corresponding to 1 bit of the register 1, latch circuit 2, X signal line 4a, /X signal line 4b, Q signal line 5a and /Q signal line 5b shown in FIG. 1. That is, the practical circuit as shown in FIG. 1 is realized by arranging the circuit configuration shown in FIG. 2 in parallel by the number of bits required.

In FIG. 2, characters 1a, 1b designate inverters in which respective outputs and inputs are connected. Characters 1c, 1d designate N-type FETs. A source electrode of the N-type FET 1c is connected to an output of the inverter 1a and an input of the inverter 1b, and a source electrode of the N-type FET 1d is connected to an input of the inverter 1a and an output of the inverter 1b. A portion corresponding to 1 bit of the register 1 shown in FIG. 1 is composed of the inverters 1a, 1b and the N-type FETs 1c, 1d.

Numerals 2a, 2b designate NAND gates in which respective outputs and first inputs are connected to constitute a Flip-flop 50. Numerals 2c, 2d, 2e and 2f respectively designate P-type FETs, whose source electrodes are connected to a source voltage Vcc.

Numerals 2g, 2h designate N-type FETs. Drain electrodes of the P-type FETs 2c, 2e and the N-type FET 2g are interconnected, and are also connected to a gate electrode of the P-type FET 2f and a second input, of the NAND gate 2a. Drain electrodes of the P-type FETs, 2d, 2f and the N-type FET 2h are interconnected, and are also connected to a gate electrode of the P-type FET 2e and a second input of the NAND gate 2b. A portion corresponding to 1 bit of the latch circuit 2 shown in FIG. 1 is composed of the NAND gates 2a, 2b, P-type FETs 2c, 2d, 2e, 2f and N-type FETs 2g, 2h.

Numerals 7a, 7b designate P-type FETs, whose source electrodes are connected to the source voltage Vcc.

A drain electrode of the N-type FET 1c, a source electrode of the N-type FET 2g and a drain electrode of the P-type FET 7a are connected to the X signal line 4a. A drain electrode of the N-type FET 1d, a source electrode of the N-type FET 2h and a drain electrode of the P-type FET 7b are connected to the /X signal line 4b. An output of the NAND gate 2a is connected to the /Q signal line 5b, and an output of the NAND gate 2b is connected to the Q signal line 5a.

Numerals 8, 9 and 10 respectively designate an RD control signal line, a /HLD control signal line and a /PCH control signal line. The RD control signal line 8 is the signal line of a signal RD for reading out a value from the register 1 and is connected to the gate electrodes of the N-type FETs 1c, 1d. The /HLD control signal line 9 is the signal line of a signal /HLD for making the latch circuit 2 hold a value, and is connected to the gate electrodes of the P-type FETs 2c, 2d and N-type FETs 2g, 2h. The /PCH control signal line 10 is the signal line of a signal /PCH for pre-charging the Q signal line 5a and the /Q signal line 5b, and is connected to the gate electrodes of the P-type FETs 7a, 7b.

Next, the operation of the conventional latch circuit and the register shown in FIG. 2 as mentioned above is described with reference to a waveform diagram of FIG. 3 showing variations of a voltage VX of the X signal line 4a and a voltage V/X of the /X signal line 4b.

In the state before transferring data to the latch circuit 2 from the register 1 composed of the inverters la, 1b and the N-type FETs 1c, 1d the RD control signal line 8, HLD control signal line 9 and /PCH control signal line 10 are of all logic "0". At this time, the N-type FETs 1c, 1d are in the non-conductive state, because the RD control signal line 8 is of logic "0". And hence, the inverters 1a, 1b are cutoff from the X signal line 4a and /X signal line 4b.

The P-type FETs 7a, 7b are in the conductive state, because the/PCH control signal line 10 is of logic "0". And hence, both the X signal line 4a and /X signal line 4b are precharged to logic "1".

The P-type FETs 2c, 2d are in the conductive state and the N-type FETs 2g, 2h are in the non-conductive state, because the /HLD control signal line 9 is of logic "0". Thus, since logic "1" is inputted to the second inputs of the NAND gates 2a, 2b, the flip-flop 50 composed of the NAND gates 2a, 2b holds the value at that time point. The P-type FETs 2e, 2f are in the non-conductive state, because logic "1" is inputted to the respective gate electrodes thereof.

The content of the register 1 is transferred to the arch circuit 2 by making the RD control signal line 8, /HLD control signal line 9 and /PCH control signal line 10 be logic "1". Hereupon, the value of the content of the register 1 is assumed to be "1". In other words, the inverter 1a is assumed to output logic "1" and the inverter 1b logic cause the RD control signal line 8 is of logic "1". Thus, electric charge on the /X signal line 4b, which is already precharged to logic "1", is discharged through the N-type FET 1d by the N-type FET of the inverter 1b which is outputting logic "0". And hence, the voltage V/X of the /X signal line 4b gradually falls from the voltage Vcc. Meanwhile, the X signal line 4a is kept at logic "1", because electric charge on the X signal line 4a, which is already precharged to logic "1", is not discharged.

When a drop in voltage VX of the /X signal line 4b becomes larger than a difference between the source voltage Vcc and a threshold voltage of an N-type FET, the N-type FET 2h becomes conductive. Thereby, electric charge of a signal line connected to the second input of the NAND gate 2b starts to flow out to the /X signal line 4b. Thus, the voltage starts to fall to the second input of the NAND gate 2b and, eventually, becomes lower than a threshold voltage Vth of the NAND gate 2b. At this time point or at a judgment point, the NAND gate 2b becomes in the state where logic "1" is outputted to the Q signal line 5a.

When a drop in voltage of the signal line connected to the second input of the NAND gate 2b becomes larger than a difference between the source voltage Vcc and a threshold voltage of the P-type FET, the P-type FET 2e becomes in the conductive state. Thereby, the signal line connected to the second input of the NAND gate 2a is prevented from becoming high impedance.

Meanwhile, since the X signal line 4a is kept at logic "1", an output of the NAND gate 2a becomes logic "0", because the logic "1" is still inputted to the second input of the NAND Mate 2a. Thereby, the data transfer to the latch circuit 2 from the register 1 is completed, because the Q signal line 5a becomes logic "1" and the /Q signal line 5b becomes logic "0".

In such a way, in the conventional latch circuit integrated on a semiconductor substrate, the input voltage to the second input of the NAND gate 2a or the NAND gate 2b constituting the internal flip-flop 50 starts to drop at the time point when a drop in the voltage VX of the X signal line 4a or the voltage V/X of the /X signal line 4b becomes larger than the difference between the source voltage Vcc and the threshold voltage of the N-type FET. The output of the NAND gate 2a or the NAND gate 2b constituting the flip-flop 50 becomes a desired state after the time point when the voltage VX of the X signal line 4a or the voltage V/X of the /X signal line 4b falls and becomes lower than the threshold voltage of the NAND gate 2a or the NAND gate 2b.

The falling speed of the voltage VX of the X signal line 4a or the voltage V/X of the /X signal line 4b is determined by a parasitic capacity of the X signal line 4a and the /X signal line 4b, and a driving capability of the N-type FET 1c and the N-type FET of the inverter 1a, or the N-type FET 1d and the N-type FET of the inverter 1b constituting the register.

In the data processor, though there are many portions which are constructed in such a manner as to interconnect the register for holding data, the latch circuit for holding the data temporarily and the arithmetic unit, particularly, in the portion such as a data path in which a number of registers are arranged, the above-mentioned parasitic capacity is very large and there is a limit to increase the driving capability of the N-type FET constituting the register and the N-type FET of the inverter from the view point of cost, and hence development of the high speed data processor is largely restricted.

SUMMARY OF THE INVENTION

The present invention has been devised in view of such circumstances, therefore it is an object thereof to provide a latch circuit which is constructed such that, an input voltage to a NAND gate constituting a flip-flop in the latch circuit used mainly as internal elements of a data processor starts to fall before the time point when a drop in voltage of an X signal line or a /X signal line becomes larger than the difference between a source voltage Vcc and a threshold voltage of an N-type FET, thereby an output of the NAND gate is in a desired state before the time point when the voltage of the X signal line or the /X signal line falls and becomes lower than the threshold voltage of the NAND gate.

It is another object of the present invention to provide a latch circuit to which a function capable of selecting a plurality of inputs is added.

The latch circuit according to the present invention is a latch circuit having a plurality of latching means, arranged in parallel, each of the latching means corresponding to 1 bit for holding and outputting a 1-bit signal value to which a positive logic value is given via a first signal line and a negative logic value is given via a second signal line, wherein each of the latching means comprises, a flip-flop which is composed of a plurality of logic gates, holds a given signal value and outputs its positive logic value to a third signal line and the negative logic value to a fourth signal line, and amplifying means having a characteristic such that, an input voltage to the flip-flop, when the signal to be held is given, starts to fall before the time point when a drop in voltage of either the first signal line or the second signal line becomes larger than the difference between a source voltage and the threshold voltage of the logic gates constituting the flip-flop.

The latch circuit according to the present invention also comprises, input selecting means for selectively giving a set among a plurality of sets of first signal line and second signal line to each of the latching means.

In the latch circuit according to the present invention, when the signal to be held is given, an input to the flip-flop is forcibly controlled by the amplifying means to a voltage close to the threshold voltage of the logic gates constituting the flip-flop.

Also, in the latch circuit according to the present invention, one out of a plurality of inputs can be selected by the input selecting means and given to the amplifying means.

The above and further objects and features of the invention will more fully be apparent from the following detailed description with accompanying drawings.

DESCRIPTION OF THE PREFERRED EMBODIMENTS

Figure 1:
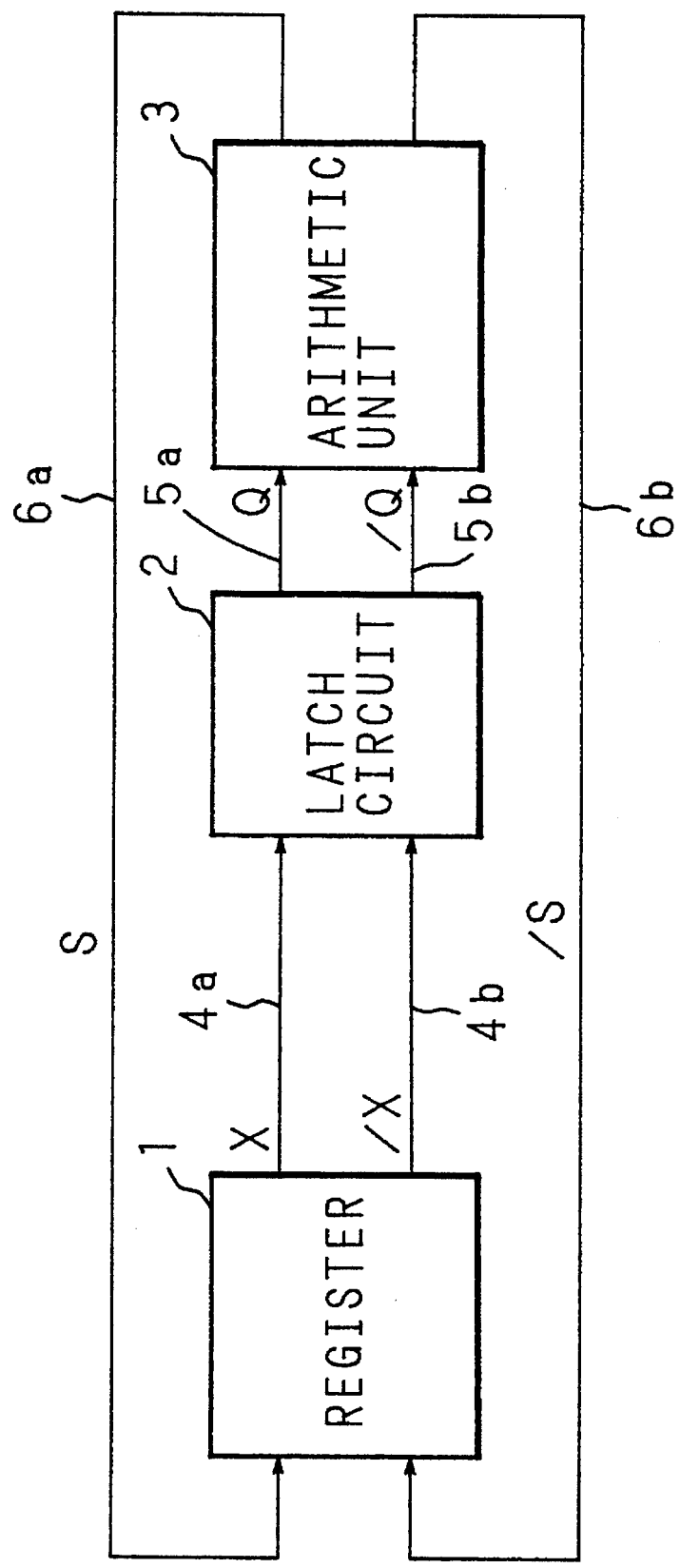
FIG. 1 is a schematic block diagram showing a state in the case of interconnecting a register, latch circuit and arithmetic unit with two signal lines of positive logic and negative logic in a general data processor.

In the following, the present invention is particularly described referring to the drawings showing its embodiments.

First Embodiment

Figure 4:
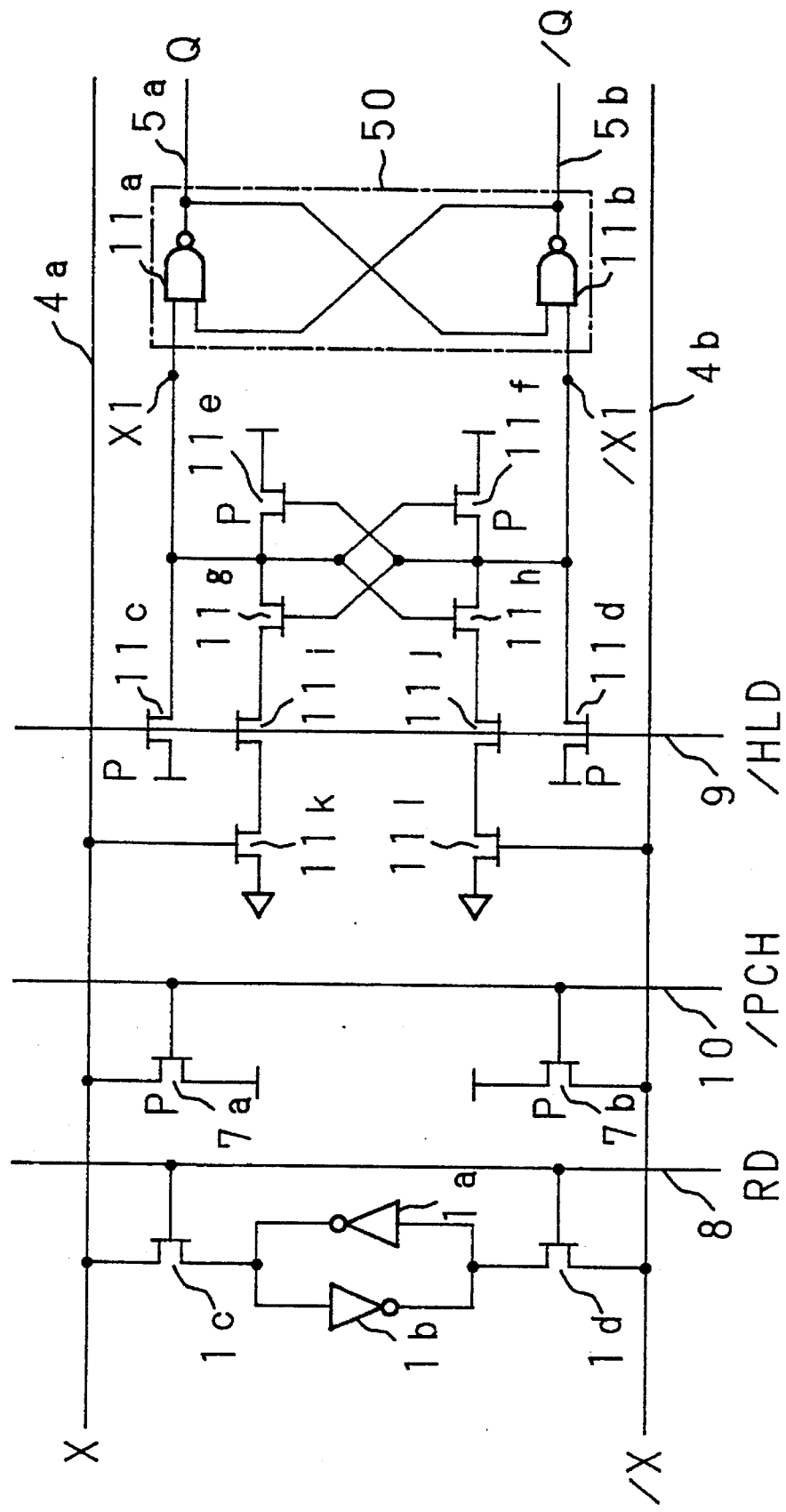
FIG. 4 is a circuit diagram showing a configuration example of a portion corresponding to 1 bit of a first embodiment of a latch circuit of the invention together with a configuration example of a portion corresponding to 1 bit of a register and the like connected thereto.

FIG. 4 is a circuit diagram specifically showing a configuration example adopting a latch circuit of the present invention to a portion corresponding to 1 bit of a register 1, a latch circuit 2, an X signal line 4a, a /X signal line 4b, a Q signal line 5a and a /Q signal 5b shown in FIG. 1. That is, by arranging a circuit configuration shown in FIG. 4 in parallel by the required number of bits, a practical circuit as shown in FIG. 1 is realized.

In FIG. 4, characters 1a, 1b designate inverters in which respective outputs and inputs are connected. Numerals 1c, 1d designate N-type FETs, a source electrode of the N-type FET 1c being connected to an output of the inverter 1a and an input of the inverter 1b, and a source electrode of the N-type FET 1d is connected to an input of the inverter 1a and an output of the inverter 1b. A portion corresponding to 1 bit of the register 1 shown in FIG. 1 is composed of the inverters 1a, 1b and the N-type FETs 1c, 1d.

Numerals 11a, 11b designate NAND gates in which respective outputs and first inputs are connected to constitute a flip-flop 50. An output of the NAND gate 11a is connected to a Q signal line 5a of positive logic, and an output of the NAND gate 11b is connected to a /Q signal line 5b of negative logic. Characters 11c, 11d, 11e and 11f designate P-type FETs, whose source electrodes are connected to a source voltage Vcc.

Characters 11g, 11h, 11i, 11j, 11k, 11l designate N-type FETs. Source electrodes of the N-type FETs 11k and 11l among them are grounded. Drain electrodes of the P-type FETs 11c, 11e and the N-type FET 11g are interconnected, and Further, connected to gate electrodes of the P-type FET 11f and N-type FET 11h and a second input of the NAND gate 11a. Drain electrodes of the P-type FETs 11d, 11f and the N-type FET 11h are interconnected, and further, connected to gate electrodes of the P-type FET 11e and N-type FET 11g and a second input of the NAND gate 11b.

A source electrode of the N-type FET 11g and a drain electrode of the N-type FET 11i, and a source electrode of the N-type FET 11i and a drain electrode of the N-type FET 11k are interconnected. A source electrode of the N-type FET 11h and a drain electrode of the N-type FET 11j, and a source electrode of the N-type FET 11j and a drain electrode of the N-type FET 11l are interconnected. Furthermore, a gate electrode of the N-type FET 11k is connected to the X signal line 4a, and a gate electrode of the N-type FET 11l is connected to the /X signal line 4b.

A differential amplifying circuit as amplifying means is composed of the P-type FETs 11c, 11d, 11e, 11f and N-type FETs 11g, 11h, 11i, 11j, 11k, 11l, and a portion corresponding to 1 bit of the latch circuit 2 is composed of the differential amplifying circuit and the NAND gates 11a, 11b.

Figure 2:
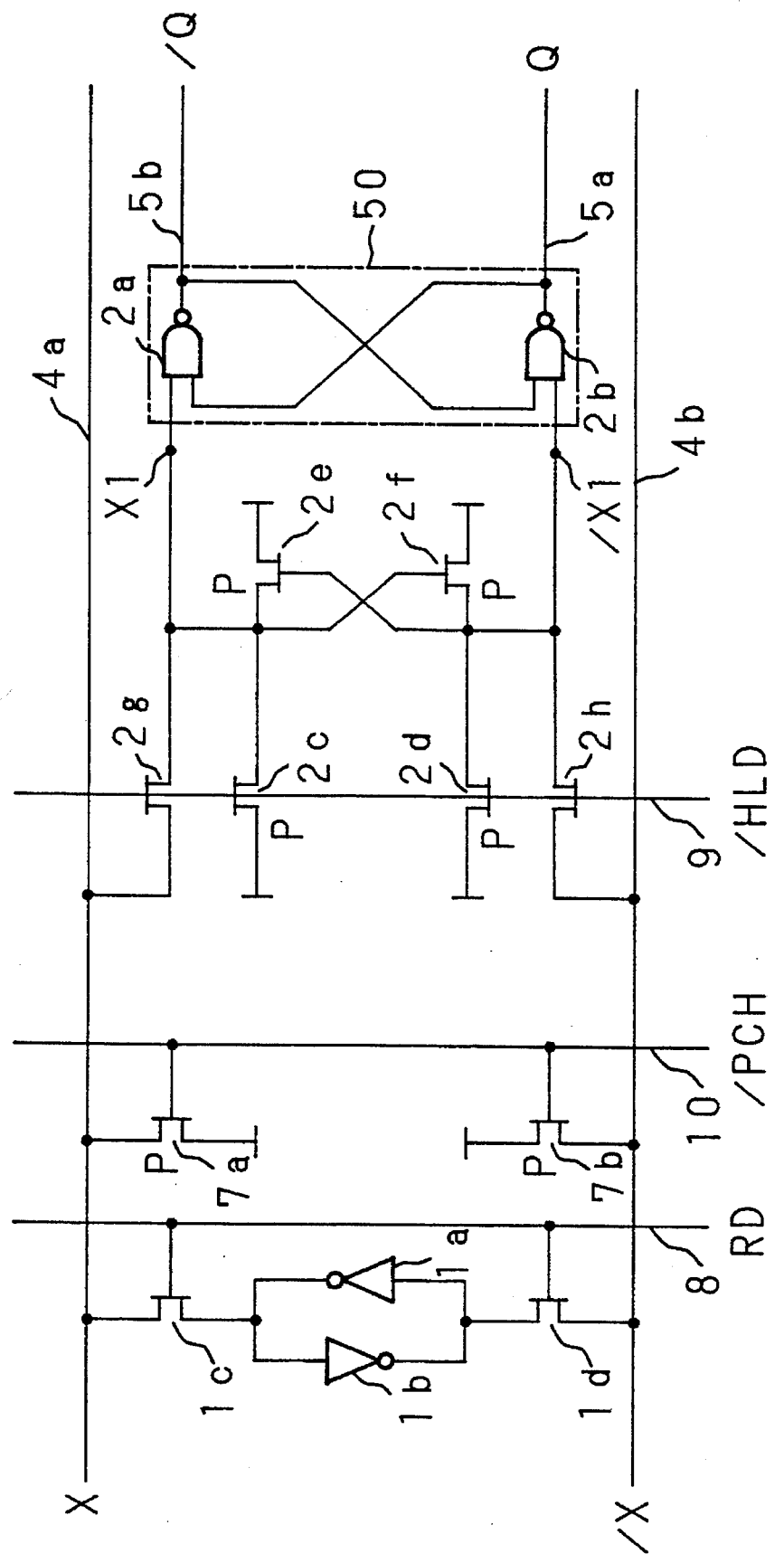
FIG. 2 is a circuit diagram showing a configuration example of a portion corresponding to 1 bit of a conventional latch circuit together with a configuration example of a portion corresponding to 1 bit of a register and the like connected thereto.
Figure 3:
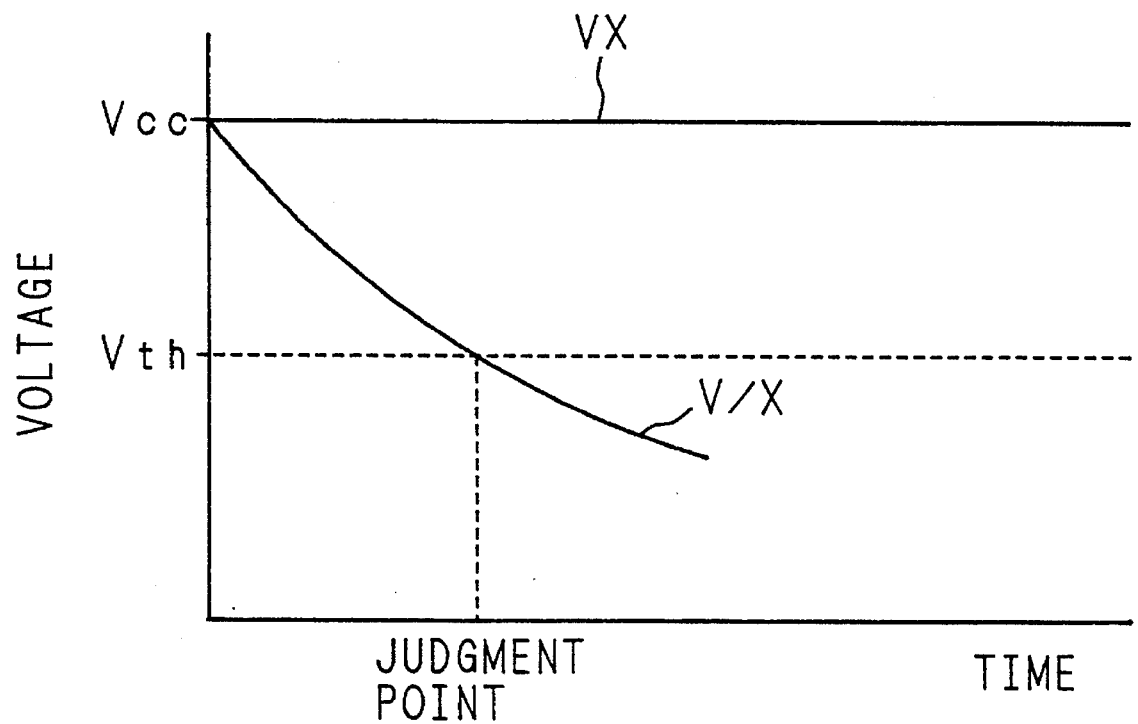
FIG. 3 is a waveform diagram for explaining the operation of a conventional latch circuit.

Characters 7a, 7b designate P-type FETs in the same way as the conventional example shown in FIG. 2. A drain electrode of the P-type FET 7a is connected to the X signal line 4a, and a drain electrode of the P-type FET 7b is connected to the /X signal line 4b, and further, their source electrodes are connected to the source voltage Vcc.

Characters 8, 9 and 10 designate an RD control signal line, a /HLD control signal line and a /PCH control signal line. The RD control signal line 8 is a signal line of a signal RD for reading a value from the register 1, and is connected to the gate electrodes of the N-type FETs 11c, 11d. The /HLD control signal line 9 is a signal line of a signal /HLD for making the latch circuit 2 hold the value, and is connected to the gate electrodes of the P-type FETs 11c, 11d and the N-type FETs 11i, 11j. The /PCH control signal line 10 is a signal line of a signal /PCH for precharging the Q signal line 5a and the /Q signal line 5b, and is connected to the gate electrodes of the P-type FETs 7a, 7b.

Figure 5:
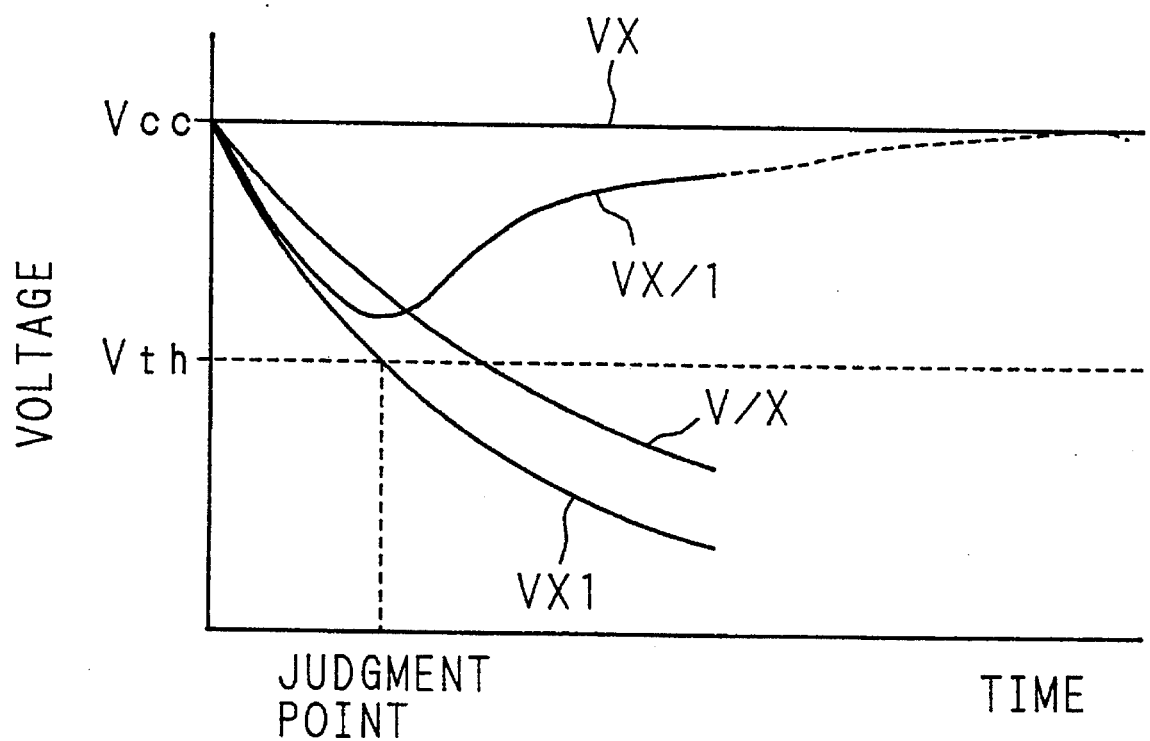
FIG. 5 is a waveform diagram for explaining the operation of a first embodiment of a latch circuit of the present invention.

Next, the operations of the latch circuit of the present invention and the register connected thereto shown in FIG. 4 as mentioned above is described with reference to a waveform diagram of FIG. 5, showing variations of the voltage VX1 of the signal line (point X1) connected to the second input of the NAND gate 11a and the voltage V/X1 of the signal line (point /X1) connected to the second input of the NAND gate 11b constituting the flip-flop 50 of the latch circuit 2 of the present invention, together with variations of the voltage VX of the X signal line 4a and the voltage V/X of the /X signal line 4b being same as the conventional example.

In the state before transferring data to the latch circuit 2 of the present invention from the register 1 composed of the inverters 1a, 1b and the N-type FETs 1c, 1d, the RD control signal line 8, /HLD control signal line 9 and /PCH control signal line 10 are logic "0". At this time, the N-type FETs 1c, 1d are in the non-conductive state, because the RD control signal line 8 is of logic "0". And hence, the inverters 1a, 1b are cut off from the X signal line 4a and /X signal line 4b.

The P-type FETs 7a, 7b are in the conductive state, because the /PCH control signal line 10 is of logic "0". And hence, the X signal line 4a and /X signal line 4b are pre-charged to logic "1".

Since the /HLD control signal line 9 is of logic "0", the P-type FETs 11c, 11d are in the conductive state, and the N-type FETs 11i, 11j are in the non-conductive state. Thus, since the logic "1" is inputted to the second inputs of the NAND gates 11a, 11b, the flip-flop 50 composed of the NAND gates 11a, 11b holds the value of that time point. Since the logic "1" is inputted to the gate electrodes of the P-type FETs 11e, 11f and N-type FETs 11g, 11h, the P-type FETs 11e, 11f are in the non-conductive state and the N-type FETs 11g, 11h are in the conductive state.

And, since the X signal line 4a and the /X signal line 4b are precharged to logic "1" as mentioned above, the N-type type FETs 11k, 11l are in the conductive state.

The content of the register 1 is transferred to the latch circuit 2 by bringing all of the RD control signal line 8, /HLD control signal line 9 and /PCH control signal line 10 to logic "1". Hereupon, it is assumed that a content value of the register 1 is "1", in other words, the inverter 1a is outputting logic "1" and the inverter 1b is outputting logic "0".

The N-type FETs 1c, 1d are in the conductive state, because the RD control signal line 8 is of logic "1". Thus, electric charge on the /X signal line 4b, which is already precharged to logic "1", is discharged through the N-type FET 1d by the N-type FET of the inverter 1b outputting logic "0". And hence, the voltage V/X of the /X signal line 4b gradually falls from the source voltage Vcc. While, since electric charge on the X signal line 4a, which is already precharged to logic "1", is not discharged, the X signal line 4a is kept intact at logic "1".

When the /HLD control signal line 9 becomes in the state of logic "1", the P-type FETs 11c, 11d become in the non-conductive state and the N-type FETs 11i, 11j become in the conductive state. In the state where the voltage VX1, V/X1 of the signal lines connected to the second inputs of the NAND gates 11a, 11b are close to the source voltage Vcc, the P-type FETs 11e, 11f are both in the non-conductive state or in a weak conductive state. Thus, the voltage VX1, V/X1 of the signal lines connected to the second inputs of the NAND gates 11a, 11b start to fall rapidly and approach to the threshold voltage Vth of the second inputs of the NAND gates 11a, 11b while keeping the state where the voltage VX1 of the signal line connected to the second input of the NAND gate 11a is a little lower than the voltage V/X1 of the signal line connected to the second input of the NAND gate 11b. This is because that, a drain current of the N-type FET 11j decreases as the voltage V/X of the /X signal line 4b falls gradually.

When the voltages VX1, V/X1 of the signal lines connected to the second inputs of the NAND gates 11a, 11b fall by a certain extent, the P-type FETs 11e, 11f become in a strong conductive state. The state where the voltage VX1 of the signal line connected to the second input of the NAND gate 11a is a little lower than the voltage V/X1 of the signal line connected to the second input of the NAND gate 11b, is still kept. And hence, a drain current of the P-type FET If is more than a drain current of the P-type FET 11e, and a drain current of the N-type FET 11g is more than a drain current of the N-type FET 11h. Thus, the difference between the voltage VX1 of the signal line connected to the second input of the NAND gate 11a and the voltage V/X1 of the signal line connected to the second input of the NAND gate 11b becomes larger, and the voltage V/X1 of the signal line connected to the second input of the NAND gate 11b starts to become larger in due time.

At the time point when the voltage VX1 of the signal line connected to the second input of the NAND gate 11a becomes lower than the threshold voltage Vth of the NAND gate 11a, the NAND gate 11a outputs logic "1" to the Q signal line 5a. Thereby, the NAND gate 11b outputs logic "0" to the /Q signal line 5b and data transfer to the latch circuit 2 from the register 1 is completed.

As mentioned above, according to the latch circuit of the present invention, the input voltage VX1, V/X1 to the NAND gates 11a, 11b constituting the flip-flop 50 in the arch circuit start to fall before the time point when a drop in voltage of either the X signal line 4a of positive logic or the /X signal line 4b of negative logic connecting the register 1 and the latch circuit 2 becomes larger than the difference between the source voltage Vcc and the threshold voltage of the N-type FET. Therefore, since the voltages VX1, V/X1 to the second inputs of the NAND gates 11a, 11b become in the desired state before the time point when the voltage VX1 of the X signal line 4a or the voltage V/X1 of the /X signal line 4b falls to become lower than the threshold voltage Vth of the NAND gates 11a11b, data is transferred from the register 1 to the latch circuit 2 at high speed.

Further, in the above-mentioned embodiment, when /HLD control signal line 9 is of logic "1", the P-type FET 11e and N-type FETs 11g, 11i, 11k form a first inverter, and the P-type FET 11f and N-type FETs 11h, 11j, 11l form a second inverter. Since these two inverters constitutes a latch in which the respective outputs of the inverters are connected to the other's inputs, the drop in the voltage of the X signal line 4a or the /X signal line 4b becomes larger, therefore there is also an effect that a feed-through current doesn't flow after an elapse of a certain time.

Second Embodiment

Figure 6:
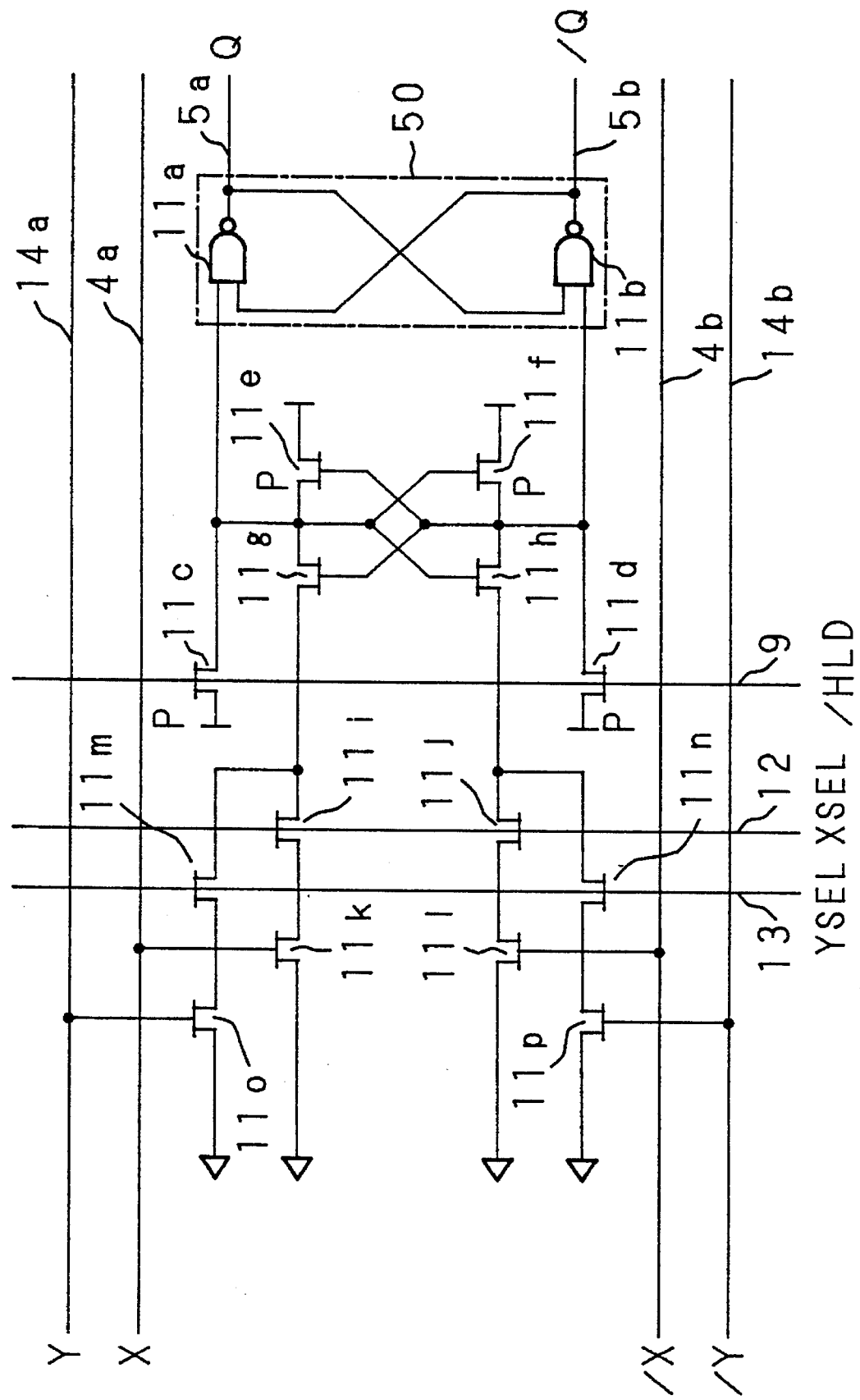
FIG. 6 is a circuit diagram showing a configuration of a portion corresponding to 1 bit of a second embodiment of a latch circuit of the present invention.

Next, explanation will be given on the second embodiment of a latch circuit of the invention referring to a circuit diagram of FIG. 6 showing a configuration example of a portion corresponding to 1 bit of the latch circuit. In addition, in the circuit diagram of FIG. 6, a portion corresponding to 1 bit of the register 1 shown in the circuit, diagram of FIG. 4 and the P-type FETs 7a, 7b for precharging the X signal line 4a and /X signal line 4b are omitted. And in the second embodiment, a configuration capable of selecting either the signal X or signal Y to input it to the latch circuit 2 is shown.

Characters 11a, 11b designate NAND gates whose respective outputs are connected to the other's first, inputs, and the NAND gates 11a, 11b consists a flip flop 50. The output of the NAND gate 11a is connected to the Q signal line 5a of positive logic and the output of the NAND gate 11b is connected to the /Q signal line 5b of negative logic. And characters 11c, 11d, 11e and 11f are the P-type FETs, each of the source electrodes thereof being connected to the source voltage Vcc.

Characters 11g, 11h, 11i, 11j, 11k, 11l, 11m, 11n, 11o and 11p designate N-type FETs. Source electrodes of the N-type FETs 11k, 11l, 11o and 11p among them are grounded. Drain electrodes of the P-type FETs 11c, 11e and the N-type FET 11g are interconnected and further, connected to gate electrodes of the P-type FET 11f and N-type FET 11h, and a second input of the NAND gate 11a. Drain electrodes of the P-type FETs 11d, 11f and N-type FET 11h are interconnected, and further connected to gate electrodes of the P-type FET 11e and N-type FET 11g, and a second input of the NAND gate 11b.

A source electrode of the N-type FET 11g, a drain electrode of the N-type FET 11i and a drain electrode of the N-type FET 11m are interconnected, and a source electrode of the N-type FET 11h, a drain electrode of the N-type FET 11j and a drain electrode of the N-type FET 11n are interconnected. A source electrode of the N-type FET 11i and a drain electrode of the N-type FET 11k, and a source electrode of the N-type FET 11j and a drain electrode of the N-type FET 11l are interconnected respectively. Furthermore, a source electrode of the N-type FET 11m and a drain electrode of the N-type FET 11o are interconnected, and a source electrode of the N-type FET 11n and a drain electrode of the N-type FET 11p are interconnected.

In the second embodiment, a differential operation amplifying circuit as amplifying means is composed of the P-type FETs 11c, 11d, 11e, 11f and the N-type FETs 11g, 11h, and a portion corresponding to 1 bit of the latch circuit 2 is composed of the differential amplifying circuit and the NAND gates 11a, 11b. Meanwhile, a portion corresponding to 1 bit of an input selecting circuit as input selecting means is composed of the N-type FETs 11i, 11j, 11k, 11l.

Characters 4a, 4b designate an X signal line and a /X signal line as same as in the aforementioned first embodiment. The X signal line 4a of positive logic is connected to a gate electrode of the N-type FET 11k, and the /X signal line 4b of negative logic is connected to a gate electrode of the N-type FET 11l. Characters 14a, 14b designate a Y signal line and a /Y signal line. The Y signal line 14a of positive logic is connected to a gate electrode of the N-type FET 11o, and the /Y signal line 14b of negative logic is connected to a gate electrode of the N-type FET 11p.

Numeral 9 designates a /HLD control signal line as same as in the first embodiment, the signal line 9 being connected to a gate electrode of the P-type FET 11c and a gate electrode of the P-type FET 11d. Numeral 12 designates an XSEL control signal line for inputting a signal X to the latch circuit 2, the signal line 12 being connected to a gate electrode of the N-type FET 11i and a gate electrode of the N-type FET 11j. Numeral 13 designates a YSEL control signal line for inputting a signal Y to the latch circuit 2, the signal line 13 being connected to a gate electrode of the N-type FET 11m and a gate electrode of the N-type FET 11n.

In the second embodiment of the latch circuit of the present invention, when data is to be held, the /HLD control signal line 9, XSEL control signal line 12 and YSEL control signal line 13 are all brought to the state of logic "0". In the case where the data is to be taken into the latch circuit from the X signal line 4a and /X signal line 4b, the /HLD control signal line 9 and XSEL control signal line 12 are brought to the state of logic "1". Thereby, the N-type FETs 11i, 11j become both in the conductive state, and the data is taken in from the X signal line 4a and /X signal line 4b through the N-type FETs 11k, 11l. At this time, since the N-type FETs 11m, 11n become in the non-conductive state, the operation of the latch circuit 2 is not affected by the N-type FETs 11m, 11n, 11o, 11p.

In the case where data is to be taken into the latch circuit 2 from the Y signal line 14a and /Y signal line 14b, the /HLD control signal line 9 and YSEL control signal line 13 are brought to the state of logic "1". Thereby, the N-type FETs 11m, 11n become both in the conductive state and the data is taken in from the Y signal line 14a and /Y signal line 14b through the N-type FETs 11o, 11p. At this time, the operation of the latch circuit 2 is not affected by the N-type FETs 11i, 11j, 11k, 11l.

As mentioned above, in the second embodiment, by controlling logic of the XSEL control signal line 12 or YSEL control signal line 13, either the inputs from the X signal line 4a and /X signal line 4b, or inputs from the Y signal line 14a and /Y signal line 14b can be selected. The other operation is same as that of the aforementioned first embodiment.

A drop in voltage of the X signal line 4a or /X signal line 4b, or the Y signal line 14a or /Y signal line 14b becomes larger, and after an elapse of a certain time, the feed-through current does not flow in the same way as in the first embodiment.

Furthermore, in the circuit diagram of the second embodiment shown in FIG. 6, though an example capable of selecting two signals X, Y is shown, by adding a set of same configuration as the configuration of the positive logic signal line (X signal line 4a or Y signal line 14a) and the N-type FET (11o or 11k) whose gate electrode is connected thereto, the negative logic signal line (/X signal line 4b or /Y signal line 14b) and the N-type FET (11l or 11p) whose gate electrode is connected thereto, and further, the control signal line (XSEL control signal line 12 or YSEL control signal line 13) and the N-type FETs (11i and 11j or 11m and 11n) whose gate electrodes are connected to the control signal line and whose drain electrodes are connected to the source electrode of the N-type FET 11g or 11h, still another signal can be added as the signal to be selected.

As particularly described heretofore, according to the latch circuit of the present invention, an input voltage to the logic gates constituting the flip-flop in the latch circuit starts to fall before the time point when a width of voltage fall of either the first (positive logic) signal line or the second (negative logic) signal line connecting the register and the latch circuit becomes larger than the difference between the source voltage and the threshold voltage of the N-type FET. And hence, since the voltage the second inputs of the logic gates is in the desired state before the time point when the voltage of the first signal line or the voltage of the second signal line falls and becomes lower than the threshold voltage of the logic gates constituting the flip-flop, data is transferred to the latch circuit from the register at high speed.

Also, according to the latch circuit of the present invention, by controlling logic of the control signal line for selecting a plurality of input signals, either of the input signals can be selected.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalents of such meets and bounds thereof are therefore intended to be embraced by the claims.

What is claimed is:

1. A latch circuit portion corresponding to 1 bit, for holding and outputting a signal value of 1 bit whose positive logic value is given via a first signal line and whose negative logic value is given via a second signal line, comprising:

a flip-flop composed of a plurality of logic gates, for holding a given signal value and for outputting the positive logic value of the given signal to a third signal line and the negative logic value of the given signal to a fourth signal line; and an amplifier coupled to an input of said flip-flop and having a characteristic such that, an input voltage to said flip-flop, when a signal to be held is given, starts to fall before the time point when a drop in voltage of either said first signal line or said second signal line becomes larger than the difference between a source voltage and a threshold voltage of one of said logic gates constituting said flip-flop.

2. The latch circuit portion as set forth in claim 1, wherein said amplifier comprises:

a first P-type FET whose source electrode is connected to a source voltage, whose gate electrode is connected to a control signal line and whose drain electrode is connected to an input of a first logic gate constituting said flip-flop;

a second P-type FET whose source electrode is connected to the source voltage, whose gate electrode is connected to said control signal line and whose drain electrode is connected to an input of a second logic gate constituting said flip-flop;

a third P-type FET whose source electrode is connected to the source voltage, whose gate electrode is connected to the input of said second logic gate and whose drain electrode is connected to the input of said first logic gate;

a fourth P-type FET whose source electrode is connected to the source voltage, whose gate electrode is connected to the input of said first logic gate and whose drain electrode is connected to the input of said second logic gate;

a first N-type FET whose drain electrode is connected to the input of said first logic gate and whose gate electrode is connected to the input of said second logic gate;

a second N-type FET whose drain electrode is connected to the input of said second logic gate and whose gate electrode is connected to the input of said first logic gate;

a third N-type FET whose drain electrode is connected to a source electrode of said first N-type FET and whose gate electrode is connected to said control signal line;

a fourth N-type FET whose drain electrode is connected to a source electrode of said second N-type FET and whose gate electrode is connected to said control signal line;

a fifth N-type FET whose drain electrode is connected to a source electrode of said third N-type FET, whose gate electrode is connected to said first signal line and whose source electrode is connected to a ground voltage; and a sixth N-type FET whose drain electrode is connected to a source electrode of said fourth N-type FET, whose gate electrode is connected to said second signal line and whose source electrode is connected to the ground voltage.

3. A circuit including a latch circuit portion corresponding to 1 bit for holding and for outputting a signal value of 1 bit whose positive logic value is given via a first signal line and whose negative logic value is given via a second signal line, and further including an input signal selecting circuit for selectively providing a signal to the first and second signal lines, wherein said latch circuit portion comprises:
 a flip-flop composed of a plurality of logic gates, for holding a given signal value and for outputting the positive logic value of the given signal to a third signal line and the negative logic value of the given signal to a fourth signal line, and
 an amplifier coupled to an input of said flip-flop and having a characteristic such that, an input voltage to said flip-flop, when a signal to be held is given, starts to fall before the time point when a drop in voltage of either said first signal line or said second signal line becomes larger than the difference between a source voltage and a threshold voltage of one of said logic gates constituting said flip-flop; and wherein said input selecting circuit comprises:

means for selectively providing a signal of one set among i, i indicating a natural number being 1 or more, sets of said first signal line and second signal line to said first and second signal lines, respectively, of said circuit portion.

4. A circuit as set forth in claim 3, wherein said amplifier comprises:

a first P-type FET whose source electrode is connected to a source voltage, whose gate electrode is connected to a control signal line and whose drain electrode is connected to an input of a first logic gate constituting said flip-flop;

a second P-type FET whose source electrode is connected to the source voltage, whose gate electrode is connected to said control signal line and whose drain electrode is connected to an input of a second logic gate constituting said flip-flop;

a third P-type FET whose source electrode is connected to the source voltage, whose gate electrode is connected to the input of said second logic gate and whose drain electrode is connected to the input of said first logic gate;

a fourth P-type FET whose source electrode is connected to the source voltage, whose gate electrode is connected to the input of said first logic gate and whose drain electrode is connected to the input of said second logic gate;

a first N-type FET whose drain electrode is connected to the input of said first logic gate and whose gate electrode is connected to the input of said second logic gate;

a second N-type FET whose drain electrode is connected to the input of said second logic gate and whose gate electrode is connected to the input of said first logic gate; and said input selecting means, comprises:
 i sets of
  third N-type FETs whose drain electrodes are connected to a source electrode of said first N-type FET and whose gate electrodes are connected to i-th selecting signal lines;
  fourth N-type FETs whose drain electrodes are connected to a source electrode of said second N-type FET and whose gate electrodes are connected to the i-th selecting signal lines;
  fifth N-type FETs whose drain electrodes are connected to source electrodes of said third N-type FETs, whose gate electrodes are connected to i-th set of first signal lines and whose source electrodes are connected to a ground voltage; and
  sixth N-type FETs whose drain electrodes are connected to source electrodes of said fourth N-type FETs, whose gate electrodes are connected to i-th set of second lines and whose source electrodes are connected to the ground voltage.

5. The latch circuit portion of claim 1, wherein said amplifier is a differential amplifier.

6. The circuit of claim 3, wherein said amplifier is a differential amplifier.

* * * * *